United States Patent [19]
Kodama

[11] Patent Number: 5,361,235
[45] Date of Patent: Nov. 1, 1994

[54] METHOD FOR ERASING DATA STORED IN A NON-VOLATILE SEMICONDUCTOR MEMORY BY USING A PREDETERMINED SERIES OF PULSES

[75] Inventor: Noriaki Kodama, Tokyo, Japan

[73] Assignee: NEC Corporation, Tokyo, Japan

[21] Appl. No.: 865,442

[22] Filed: Apr. 9, 1992

[30] Foreign Application Priority Data

Apr. 10, 1991 [JP] Japan .................... 3-076636

[51] Int. Cl.$^5$ .............................................. G11C 7/00
[52] U.S. Cl. ........................................ 365/218; 365/185
[58] Field of Search ................... 365/218, 185, 900

[56] References Cited

U.S. PATENT DOCUMENTS

| | | | |
|---|---|---|---|
| 4,279,024 | 7/1981 | Schrenk | 365/218 |
| 4,384,349 | 5/1983 | McElroy | 365/218 |
| 4,435,785 | 3/1984 | Chapman | 365/218 |
| 5,043,940 | 8/1991 | Harari | 365/900 |
| 5,095,344 | 3/1992 | Harari | 365/900 |
| 5,122,985 | 6/1992 | Santin | 365/185 |

Primary Examiner—Eugene R. LaRoche
Assistant Examiner—Son Dinh
Attorney, Agent, or Firm—Sughrue, Mion, Zinn, Macpeak & Seas

[57] ABSTRACT

A method for erasing data stored in a non-volatile semiconductor memory is applied to a memory cell transistor including a p-type well region, a source and a drain formed within the p-type well region, and a composite gate including a floating gate electrode formed on the p-type well region. In the method, a plurality of pulses having a high positive voltage is applied to the p-type well region so that a product ($I \times N$) of a pulse interval (I) and a number of the plurality of pulses (N) becomes not smaller than 0.1 s on condition that the control gate electrode is fixed to the ground level and the source and drain are kept at a floating state.

6 Claims, 8 Drawing Sheets

METHOD FOR ERASING DATA STORED IN A NON-VOLATILE SEMICONDUCTOR MEMORY BY USING A PREDETERMINED SERIES OF PULSES

FIELD OF THE INVENTION

This invention relates to a method for erasing data stored in a non-volatile semiconductor memory, and more particularly to, a method for erasing data stored in a non-volatile semiconductor memory which includes a memory cell transistor including a composite gate including a floating gate electrode.

BACKGROUND OF THE INVENTION

In a first conventional method for erasing data stored in a non-volatile semiconductor memory such as an electrically erasable programmable read only memory (EEPROM), especially, a flash EEPROM, data stored in the whole memory cell array or one block divided therefrom which composes the non-volatile semiconductor memory fabricated on a semiconductor chip are erased electrically in one erasing operation. Such an erasing operation is carried out by applying a high voltage to a memory cell transistor composing the non-volatile semiconductor memory. One type of the memory cell transistor in which the erasing operation is carried out includes a source and a drain formed within the surface of a p-type semiconductor substrate with a predetermined distance, and a composite gate consisting of a first gate insulation layer, a floating gate electrode, a second gate insulation layer and a control gate electrode formed between the source and the drain on the p-type semiconductor substrate.

In operation of erasing data stored in the memory cell transistor, the source is applied with a high positive voltage on condition that the control gate electrode is fixed to the ground level and the drain is kept at a floating state. On these conditions, the electrons accumulated in the floating gate electrode are transferred to the source through the first gate insulation layer located between the floating gate electrode and the source by Fouel-Nordheim (F-N) tunnelling.

In a second conventional method for erasing data stored in a non-volatile semiconductor memory, one pulse of a high voltage is applied to a memory cell transistor. One type of the memory cell transistor in which the erasing operation is carried out includes p-type well region formed within the surface of an n-type semiconductor substrate, a source and a drain formed within the surface of the p-type well region with a predetermined distance, and a composite gate consisting of a first gate insulation layer, a floating gate electrode, a second gate insulation layer and a control gate electrode formed between the source and the drain on the p-type well region.

In operation of erasing data in the memory cell transistor, the p-type well region and the n-type semiconductor substrate are applied with one pulse of a high positive voltage on condition that the control gate electrode is fixed to the ground level and the source and drain are kept at a floating state. On these conditions, the electrons accumulated in the floating gate electrode are transferred to the p-type well region through the first gate insulation layer by F-N tunnelling.

The second conventional method for erasing data stored in a non-volatile semiconductor memory has been described on page 129 of 1990 Symposium on VLSI Technology Digest of Technical Papers, entitled "A NAND STRUCTURED CELL WITH A NEW PROGRAMING TECHNOLOGY FOR HIGHLY RELIABLE 5V-ONLY FLASH EEPROM".

According to the fist and second conventional methods for erasing data stored in a non-volatile semiconductor memory, however, there are disadvantages as described below. In the first conventional method for erasing data stored in a non-volatile semiconductor memory, a deep depletion layer is generated in the surface of the source located below the floating gate electrode by applying such a high positive voltage, so that there is induced the inter-band tunnelling which causes the generation of holes therein. The holes thus generated are partly injected to the first gate insulation layer which is deteriorated thereby.

In the second conventional method for erasing data stored in a non-volatile semiconductor memory, other circuit elements fabricated in the p-type semiconductor substrate for activating the erasing operation of the memory cell transistor are isolated by corresponding p-type well regions which are fixed to the ground level to avoid electrical effects of the erasing operation of the memory cell transistor in the p-type well region to which a high positive voltage is applied. In this second conventional method for erasing data stored in a non-volatile semiconductor memory, the inter-band tunnel current does not flow during the erasing operation, so that the first gate insulation layer is not deteriorated thereby. However, the threshold voltage of the memory cell transistor tends to shift toward a negative region after the erasing operation is carried out, because many electrons are trapped in the whole layer of the first gate insulation layer under the floating gate electrode, and then released due to the self-field of the floating gate electrode. If the threshold voltage shifts toward the negative region after the erasing operation, the memory cell transistor may become at the depletion state which is a so called over-erasing state.

SUMMARY OF THE INVENTION

Accordingly, it is an object of the invention to provide a method for erasing data stored in a non-volatile semiconductor memory in which a first gate insulation layer of a composite gate of a memory cell transistor composing the non-volatile semiconductor memory is not deteriorated thereby.

It is another object of the invention to provide a method for erasing data stored in a non-volatile semiconductor memory in which a threshold voltage of the memory cell transistor changes little after erasing data.

According to a feature of the invention, a method for erasing data stored in a non-volatile semiconductor memory comprises the steps of:

providing a memory cell transistor comprising a p-type well region, a source and a drain formed within the p-type well region, a composite gate consisting of a first gate insulation layer, a floating gate electrode, a second gate insulation layer and a control gate electrode formed on the p-type well region; and applying series of pulses having a high positive voltage to the p-type well region so that a product $(I \times N)$ of a pulse interval $(I)$ and a number of the series of pulses $(N)$ becomes not smaller than a predetermined time on condition that the control gate electrode is fixed to the ground level and the source and drain are kept at a floating state.

BRIEF DESCRIPTION OF THE DRAWINGS

The invention will be explained in more detail in conjunction with appended drawings wherein.

DESCRIPTION OF THE PREFERRED EMBODIMENTS

Before describing a method for erasing data stored in a non-volatile semiconductor memory in preferred embodiments according to the invention, the first and second conventional methods for erasing data stored in a non-volatile semiconductor memory described before will be explained.

Figure 1:
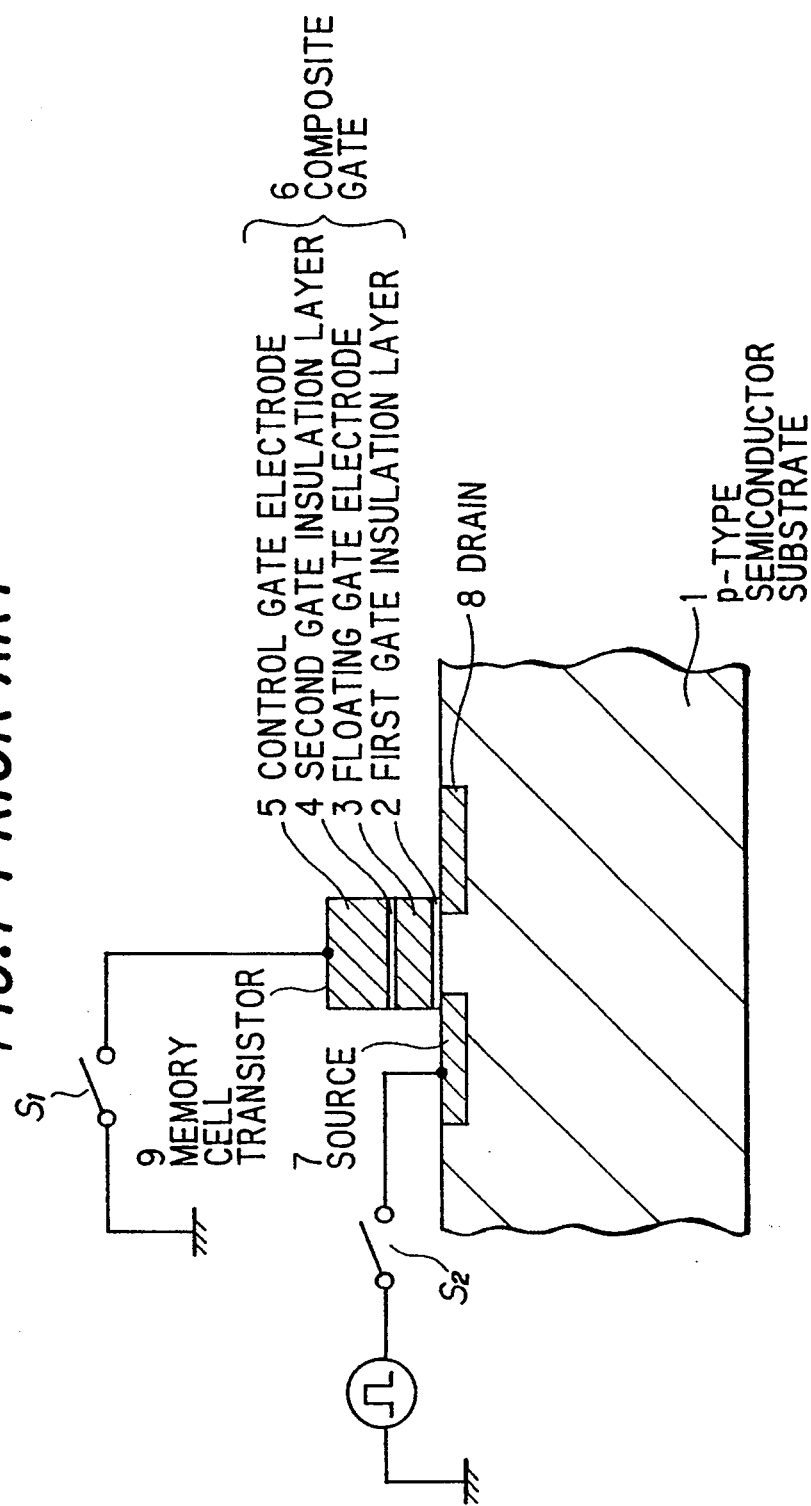
FIG. 1 is a cross-sectional view illustrating a first type memory cell transistor in which a first conventional method for erasing data stored in a non-volatile semiconductor memory is carried out.

FIG. 1 shows a first type memory cell transistor of a non-volatile semiconductor memory in which a first conventional method for erasing data stored in a non-volatile semiconductor memory is carried out. In the memory cell transistor, a source 7 and a drain 8 both consisting of n-type diffusion layers are formed within the surface of a p-type semiconductor substrate 1 with a predetermined distance. Further, a composite gate 6 consisting of a first gate insulation layer 2, a floating gate electrode 3, a second gate insulation layer 4 and a control gate electrode 5 is formed between the source 7 and the drain 8 on the p-type semiconductor substrate 1.

In operation of erasing data stored in the memory cell transistor, the source 7 is applied with a high positive voltage on condition that the control gate electrode 5 is fixed to the ground level and the drain 8 is kept at a floating state ($S_1$: ON and $S_2$: ON). On these conditions, the electrons accumulated in the floating gate electrode 3 are transferred to the source 7 through the first gate insulation layer 2 located between the floating gate electrode 3 and the source 7 by F-N tunnelling.

Figure 2:
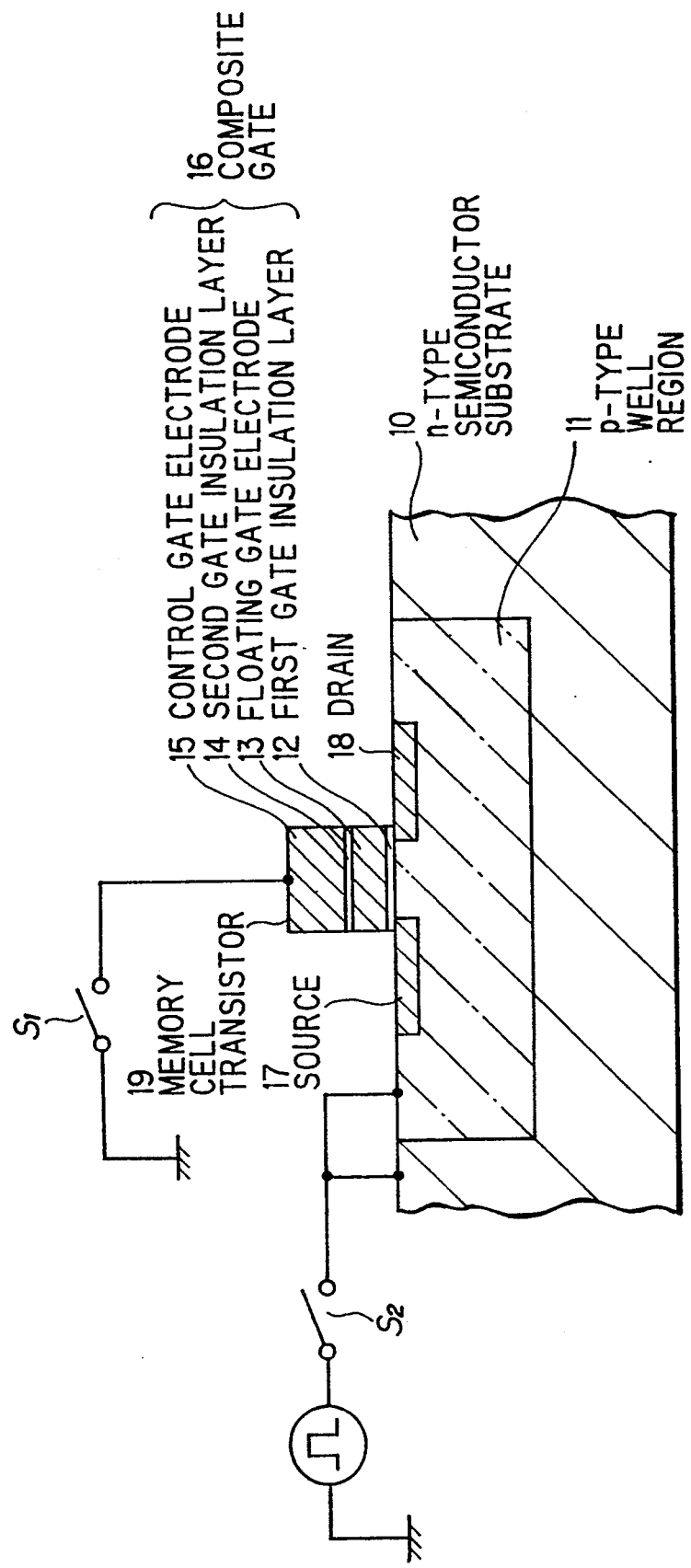
FIG. 2 i s a cross-sectional view illustrating a second type memory cell transistor in which a second conventional method for erasing data stored in a non-volatile semiconductor memory is carried out.

FIG. 2 shows a second type memory cell transistor in which a second conventional method for erasing data stored in a non-volatile semiconductor memory is carried out. In the memory cell transistor, a p-type well region 11 is formed in an n-type semiconductor substrate 10. A source 17 and a drain 18 both consisting of n-type diffusion layers are formed within the surface of the p-type well region with a predetermined distance. Further, a composite gate 16 consisting of a first gate insulation layer 12, a floating gate electrode 13, a second gate insulation layer 14 and a control gate electrode 15 is formed between the source 17 and the drain 18 on the p-type well region 11.

In operation of erasing data stored in the memory cell transistor, the p-type well region 11 and the n-type semiconductor substrate 10 are applied with one pulse of a high positive voltage on condition that the control gate electrode 15 is fixed to the ground level and the source and drain 17 and 18 are kept at a floating state ($S_1$: ON and $S_2$: ON). On these conditions, the electrons accumulated in the floating gate electrode 13 are transferred to the p-type well region 11 through the first gate insulation layer 12 by F-N tunnelling.

Figure 3:
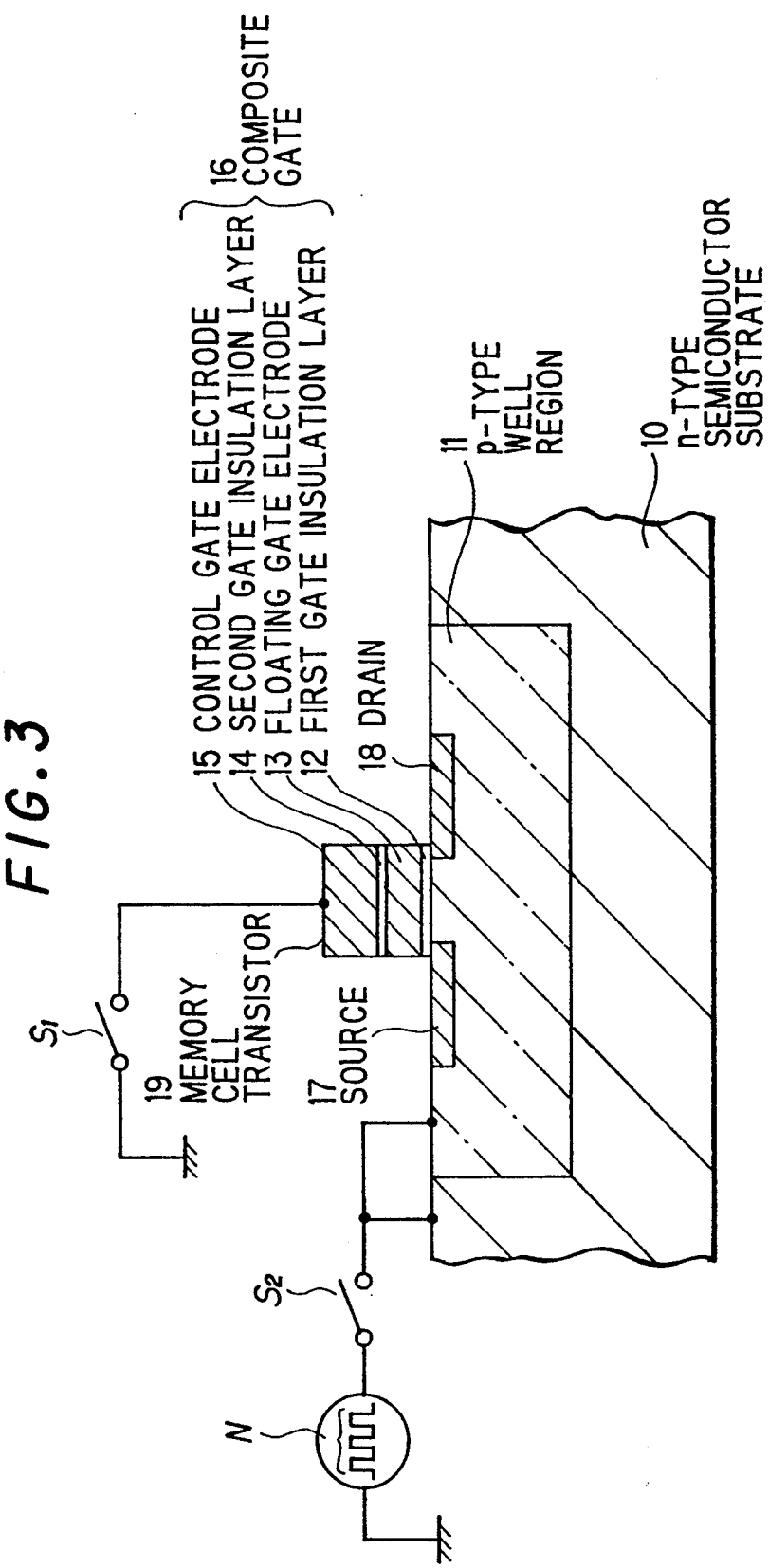
FIG. 3 is a cross-sectional view illustrating the second type memory cell transistor in which a method for erasing data stored in a non-volatile semiconductor memory in a first preferred embodiment according to the invention is carried out.

Next, a method for erasing data stored in a non-volatile semiconductor memory in a first preferred embodiment will be explained in FIG. 3, wherein the structure of a non-volatile semiconductor memory cell is the same as that of FIG. 2, and like parts are indicated by like reference numerals. In the memory cell transistor, a p-type well region 11 having an impurity concentration of $5 \times 10^{16} \text{cm}^{-3}$ and a depth of 1.2 $\mu$m is formed within an n-type semiconductor substrate 10. A source 17 and a drain 18 both consisting of n-type diffusion layers are formed within the surface of the p-type well 11 with a predetermined distance. Further, a composite gate 16 consisting of a first gate insulation layer 12 consisting of a silicon oxide layer having a thickness of 100 Å, a floating gate electrode 13, a second gate insulation layer 14 consisting of a multi-layer of a silicon oxide layer and a silicon nitride layer having an effective thickness of 200 Å and a control gate electrode 15 is formed between the source 17 and the drain 18 on the p-type well region 11.

In operation of erasing data stored in the memory cell transistor 19, it is supposed that the threshold voltage is 8.0 v. In such a case, the p-type well region 11 and the n-type semiconductor substrate 10 are applied with a series of pulses each having a voltage of 12 v and a width of 10 ms to provide a product $(I \times N)$ of a pulse interval (I) and a number of pulses (N) not to be smaller than 0.1 s on condition that the control gate electrode 15 is fixed to the ground level and the source and drain 17 and 18 are kept at a floating state ($S_1$: ON and $S_2$: ON). For example, the electrons accumulated in the floating gate electrode 13 are transferred to the p-type well region 11 by F-N tunnelling by applying 100 pulses with a pulse interval of 10 ms. The threshold voltage of the memory cell transistor 19 becomes approximately 2.0 v after the erasing operation is carried out. The threshold voltage thus obtained is stable with little change as the time passes.

Figure 4:
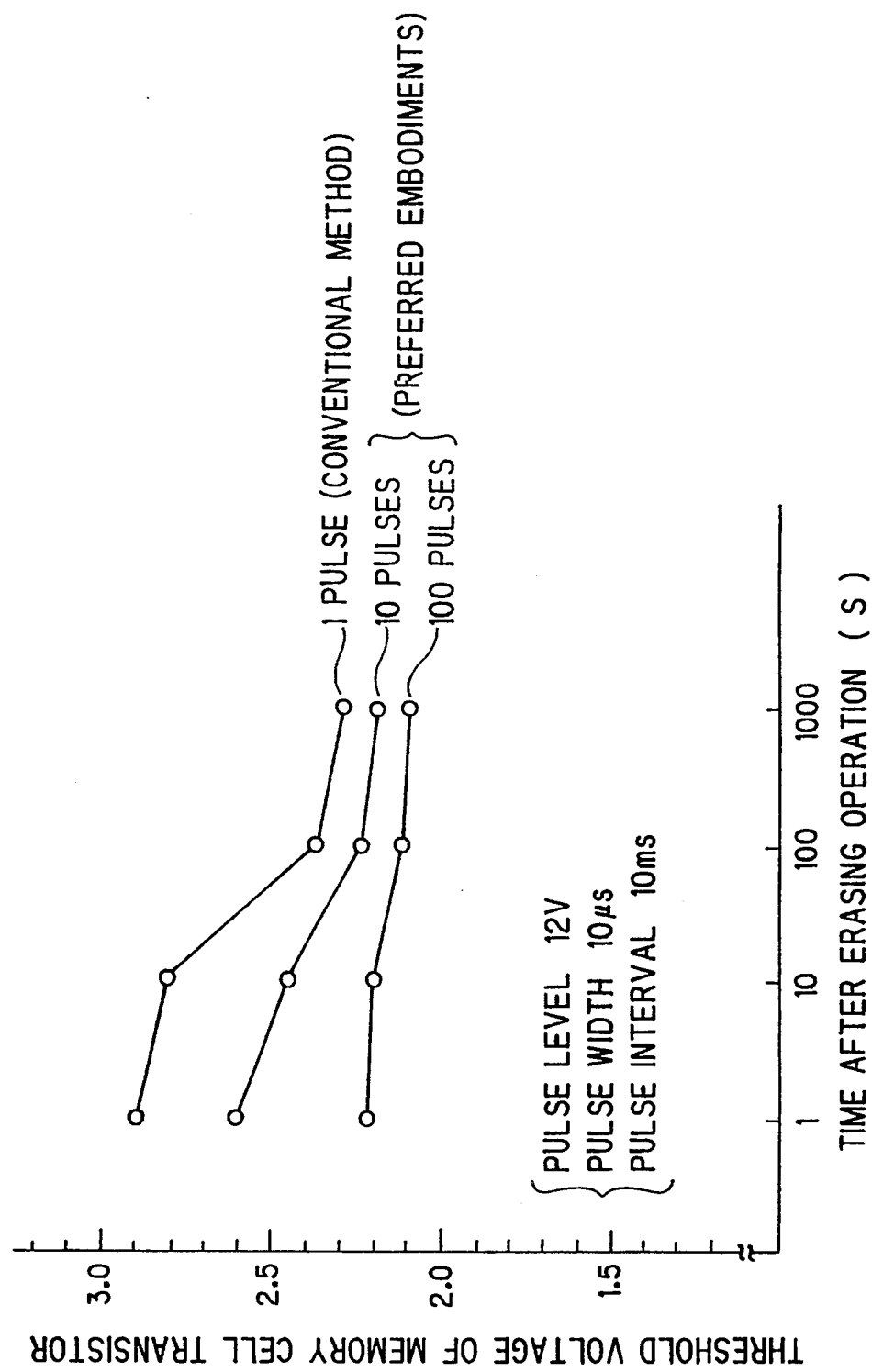
FIG. 4 is a graph showing the changes of the threshold voltage of the memory cell transistor in terms of time after the erasing operation is carried out in comparing among various numbers of pulses applied in the erasing operations.

FIG. 4 shows the changes of the threshold voltage of the memory cell transistor in terms of the time after the erasing operation is carried out. In the erasing operation, three different numbers (N) of pulses are applied, that are 1, 10 and 100 pulses. Each pulse has a voltage of 12 v and a width of 10 μs. The pulse interval (I) is set to be 10 ms. In case of applying only one pulse, corresponding to the second conventional method, the change of the threshold voltage is relatively large, and the threshold voltage continues to decrease until 1000 s passes after the erasing operation is finished. On the other hand, the change of the threshold voltage becomes small as the number of the pulses applied in the erasing operation becomes large. Especially, the threshold voltage changes little in case of applying 100 pulses. It is thought that the threshold voltage changes after the erasing operation is finished because the electrons released gradually from the floating gate electrode 13 by the self-field of the floating gate electrode 13 are trapped by the first gate insulation layer 12 under the floating gate electrode 13, so that it is thought that the number of electrons trapped by the first gate insulation layer 12 becomes small to mare the change of the threshold voltage small as the number of the pulses applied in the erasing operation becomes large.

Figure 5:
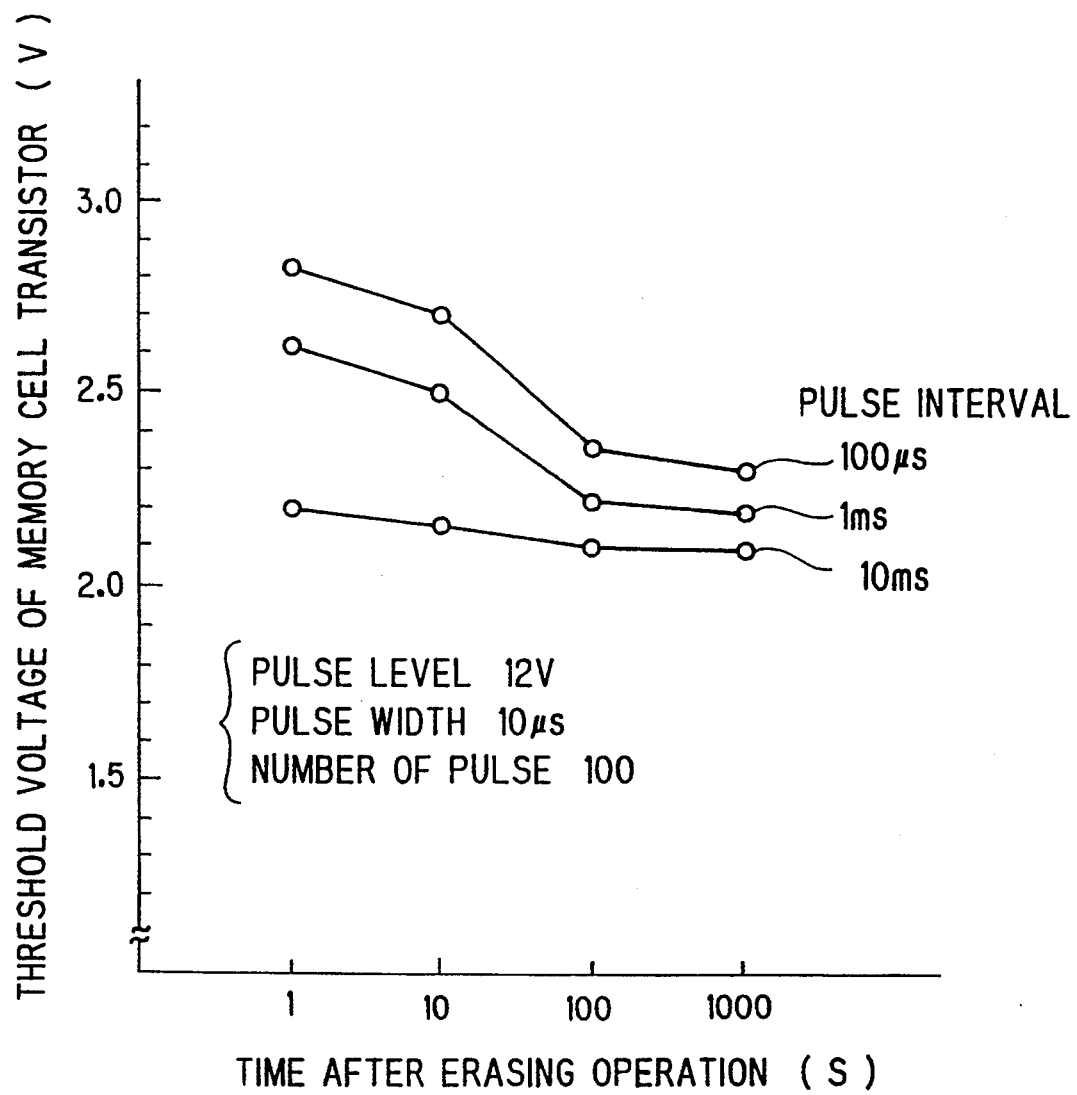
FIG. 5 is a graph showing the changes of the threshold voltage of the memory cell transistor in terms of time after the erasing operation is carried out in comparing among various pulse intervals.

FIG. 5 shows the changes of the threshold voltage of the memory cell transistor in terms of the time after the erasing operation is carried out. In the erasing operation, 100 pulses are applied. Each pulse has a voltage of 12 v and a width of 10 μs. The pulses are applied with three different pulse intervals (I), that are 100 μs, 1 ms and 10 ms. In case of applying the pulses with the interval of 100 μs, the change of the threshold voltage is large as like in case of applying only one pulse. However, it is observed that the change of the threshold voltage becomes small in case of applying the pulses with the interval of 1 ms and over. It is thought that the electrons trapped by the first gate insulation layer 12 are released to the p-type well region 11 during the pulse interval during which the high voltage is not applied, so that it is thought that the number of electrons trapped by the first gate insulation layer 12 becomes small to make the change of the threshold voltage small as the pulses interval becomes large.

Figure 6:
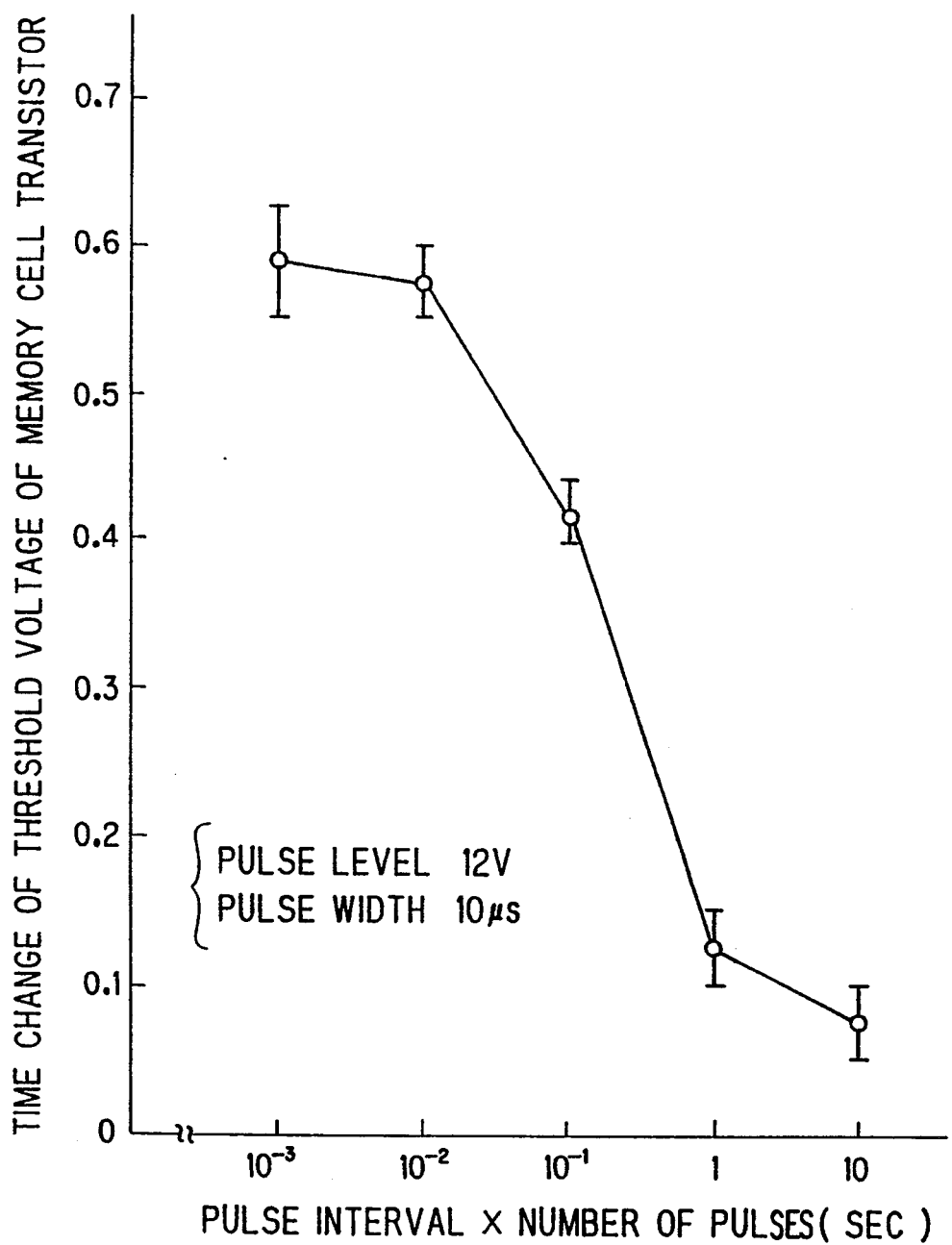
FIG. 6 is a graph showing the amount of changes of the threshold voltage of the memory cell transistor within a period of time from 1 to 1000 s after the erasing operation is carried out in terms of a product $(I \times N)$ of the pulse interval (I) and the number (N) of the pulses.

FIG. 6 shows the amount of changes of the threshold voltage of the memory cell transistor in a period of time from 1 to 1000 s after the erasing operation is carried out in terms of a product (I×N) of the pulse interval (I) and the number (N) of the pulses. In the erasing operation, each pulse has a voltage of 12 v and a width of 10 μs. It is observed that the change of the threshold voltage tends to decrease when the product (I×N) is approximately 0.1 s and over. Therefore, a stable threshold voltage of the memory cell transistor can be obtained by applying the pulses of a positive high voltage to the p-type well region 11 and the n-type semiconductor substrate 10 in the erasing operation so that the product (I×N) of the pulse interval (I) and the number (N) of the pulses becomes 0.1 s and over.

Figure 7:
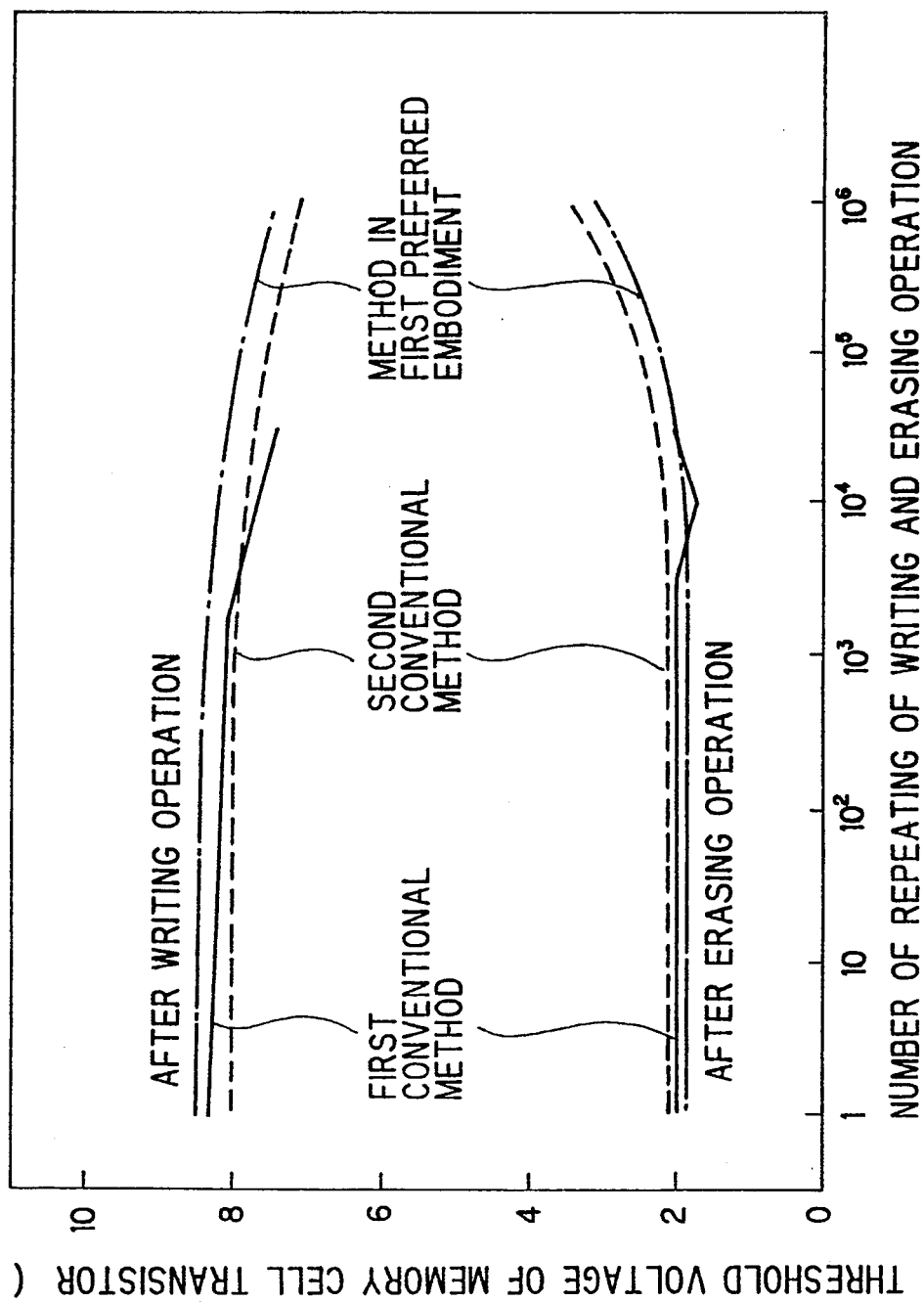
FIG. 7 i s a graph showing the threshold voltage of the memory cell transistor after writing and erasing operations are repeatedly carried out in comparing among various methods of erasing operation.

FIG. 7 shows the threshold voltage of the memory cell transistor after writing and erasing operations repeatedly carried out in comparing among various methods of erasing operation. The writing operation is carried out by applying pulses of 6 v having a width of 100 μs to the drain on condition that the control gate electrode is applied with 14 v and t he source is fixed to the ground level so that channel hot electrons are injected to the floating gate electrode. In the first conventional method for erasing data stored in the memory cell transistor, a pulse of 10 v having a width of 10 ms is applied to the source on condition that the control gate electrode is fixed to the ground level and the drain is kept at a floating state. In the second conventional method for erasing data stored in the memory cell transistor, a pulse of 13 v having a width of 10 ms is applied to the p-type well region and the n-type semiconductor substrate on condition that the control gate electrode is fixed to the ground level and the source and the drain are kept at a floating state.

As understood by FIG. 7, a difference between the threshold voltages after the writing operation and the erasing operation becomes small as the number of the repeated operations of writing and erasing becomes large in any method, however, a change of the difference in the first conventional method is the largest and that in the method in the first preferred embodiment is the smallest in the three methods. Therefore, the characteristic of the repeated operations of writing and erasing in the first preferred embodiment is the best in the three methods.

Figure 8:
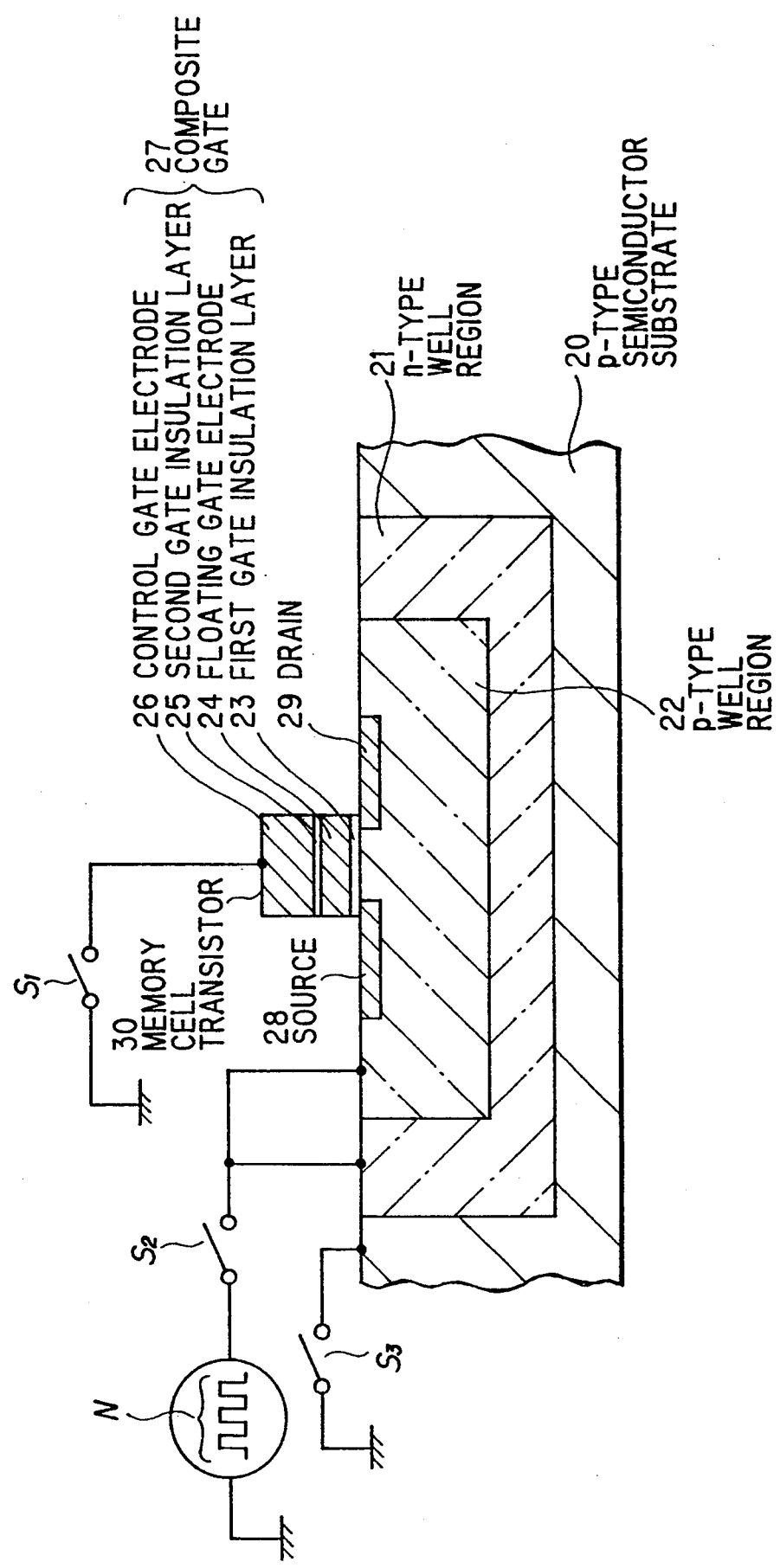
FIG. 8 is a cross-sectional view illustrating a third type memory cell transistor in which a method for erasing data stored in a non-volatile semiconductor memory in a second preferred embodiment according to the invention is carried out.

Next, a method for erasing data stored in a non-volatile semiconductor memory in a second preferred embodiment will be explained. The method for erasing data in a non-volatile semiconductor memory is applied to a third type memory eel 1 transistor 30 shown in FIG. 8. In the memory cell transistor 30, an n-type well region 21 having an impurity concentration of $3 \times 10^{16}$ cm$^{-3}$ and a depth of 2.0 μm is formed within a p-type semiconductor substrate 20. A p-type well region 22 having an impurity concentration of $5 \times 10^{16}$ cm$^{-3}$ and a depth of 1.2 μm is formed within the n-type well region 21. A source 28 and a drain 19 both consisting of n-type diffusion layers are formed within the surface of the p-type well region 22 with a predetermined distance. Further, a composite gate 27 consisting of a first gate insulation layer 23 consisting of a silicon oxide layer, a floating gate electrode 24, a second gate insulation layer 25 consisting of a multi-layer of a silicon oxide layer and a silicon nitride layer and a control gate electrode 26 is formed between the source and drain 28 and 29 on the p-type well region 22.

In operation of erasing data stored in the memory cell transistor 30, the n-type well region 21 and the p-type well region 22 are applied with 100 pulses each having a voltage of 12 v and a width of 10 μs with an interval of 10 ms so that the electrons accumulated in the floating gate electrode 24 are transferred to the p-type well region 22 by F-N tunnelling on condition that the control gate electrode 26 and the p-type semiconductor substrate 20 are fixed to the ground level and the source and drain 28 and 29 are kept at a floating state (S$_1$: ON, S$_2$: ON and S$_3$: ON).

In the second preferred embodiment, the p-type semiconductor substrate 20 is fixed to the ground level, so that other circuit elements formed on the p-type semiconductor substrate 20 for activating the erasing operation of the memory cell transistor 30 are not always required to be formed within well regions to avoid effects of a high voltage applied in the erasing operation of the memory cell transistor 30, Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A method for erasing data stored in a non-volatile semiconductor memory, comprising the steps of:

providing a memory cell transistor comprising a p-type well region, a source and a drain formed within said p-type well region, a composite gate consisting of a first gate insulation layer, a floating gate electrode, a second grate insulation layer and a control gate electrode formed on said p-type well region; and applying a predetermined number (N) of serial pulses each having a high positive voltage and a pulse interval (I) relative to an adjacent pulse, to said p-type well region when said control gate electrode is fixed to the ground level and said source and drain are kept at a floating state, the product (I×N) being not smaller than a predetermined time, wherein said pulse interval (I) is not smaller than 1 ms.

2. A method for erasing data stored in a non-volatile semiconductor memory, according to claim 1, wherein:
said p-type well region is formed within an n-type semiconductor substrate; and
said series of pulses is applied to said n-type semiconductor substrate as well as said p-type well region.

3. A method for erasing data stored in a non-volatile semiconductor memory, according to claim 1, wherein:
said p-type well region is formed within an n-type well region; and
said series of pulses is applied to said n-type well region as well as said p-type well region.

4. A method for erasing data stored in a non-volatile semiconductor memory, according to claim 3, wherein:
said n-type well region is formed within a p-type semiconductor substrate; and
said p-type semiconductor substrate is fixed to the ground level.

5. A method for erasing data stored in a non-volatile semiconductor memory, according to claim 1, wherein:
said series of pulses are applied to said p-type well region so that said product (I×N) becomes not smaller than 0.1 s.

6. A method for erasing data stored in a non-volatile semiconductor memory, according to claim 1, wherein:
said number of said series of pulses (N) is not smaller than ten.

* * * * *

UNITED STATES PATENT AND TRADEMARK OFFICE
CERTIFICATE OF CORRECTION

PATENT NO. : 5,361,235
DATED : NOVEMBER 1, 1994
INVENTOR(S) : KODAMA

It is certified that error appears in the above-identified patent and that said Letters Patent is hereby corrected as shown below:

Col. 3, line 34, delete "i s" and insert --is--.

Col. 5, line 2, delete "mare" and insert --make--.

Col. 5, line 63, delete "t he" and insert --the--.

Col. 6, line 24, delete "eel" and insert --cell--.

Signed and Sealed this

Twenty-first Day of February, 1995

Attest:

BRUCE LEHMAN

Attesting Officer     Commissioner of Patents and Trademarks